US009137918B2

(12) United States Patent
Chuang et al.

(10) Patent No.: US 9,137,918 B2
(45) Date of Patent: Sep. 15, 2015

(54) ELECTRONIC APPARATUS AND METHOD FOR ASSEMBLING THE SAME

(71) Applicant: HTC Corporation, Taoyuan County (TW)

(72) Inventors: I-Cheng Chuang, Taoyuan County (TW); Yu-Jing Liao, Taoyuan County (TW); Ying-Yen Cheng, Taoyuan County (TW); Yin-Chou Chen, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 61 days.

(21) Appl. No.: 13/629,625

(22) Filed: Sep. 28, 2012

(65) Prior Publication Data

US 2014/0092564 A1      Apr. 3, 2014

(51) Int. Cl.
*H05K 5/00* (2006.01)
*H05K 7/06* (2006.01)
(Continued)

(52) U.S. Cl.
CPC .............. *H05K 7/06* (2013.01); *G06F 1/1626* (2013.01); *H04M 1/0202* (2013.01);
(Continued)

(58) Field of Classification Search
CPC .................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–5/08; H05K 7/20; H05K 7/00; H05K 7/1422; H05K 1/0218–1/0219; H05K 1/00; H05K 3/00; H05K 9/00; H05K 7/06; H05K 13/0023; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00
USPC ............. 361/679.01–679.45, 679.55–679.61, 361/728–821, 724–730; 455/575.1, 550.1, 455/347; 379/433.01; 206/308.3
See application file for complete search history.

(56) References Cited

U.S. PATENT DOCUMENTS 7,336,228 B2   2/2008 Lu et al.
8,280,463 B2 * 10/2012 Hori et al. .................. 455/575.3
(Continued)

FOREIGN PATENT DOCUMENTS

CN   101416473   4/2009
CN   101080876   7/2012
WO   2006065934  6/2006

OTHER PUBLICATIONS

"Office Action of Taiwan Counterpart Application", issued on Sep. 26, 2014, p. 1-p. 8.
(Continued)

*Primary Examiner* — Anthony Haughton
*Assistant Examiner* — Razmeen Gafur
(74) *Attorney, Agent, or Firm* — Jianq Chyun IP Office

(57) ABSTRACT

An electronic apparatus including a housing, a motherboard, a battery module and a display module is provided. The housing has at least an opening and an accommodating space. The motherboard is disposed in the accommodating space. The battery module is disposed in the accommodating space and stacked over the motherboard. The motherboard is located between the housing and the battery module. The display module is disposed in the accommodating space and stacked over the battery module. The battery module is located between the motherboard and the display module. At least one edge of the battery module in a width direction of the battery module is closer to a corresponding side of the housing than a corresponding edge of the motherboard in a width direction of the motherboard.

20 Claims, 4 Drawing Sheets

(51) Int. Cl.
   *H04M 1/02*    (2006.01)
   *H05K 13/00*   (2006.01)
   *G06F 1/16*    (2006.01)

(52) U.S. Cl.
   CPC ......... *H04M 1/0262* (2013.01); *H04M 1/0277* (2013.01); *H05K 13/0023* (2013.01); *H04M 1/0266* (2013.01); *Y10T 29/49124* (2015.01); *Y10T 29/49126* (2015.01)

(56) References Cited

U.S. PATENT DOCUMENTS

| | | | |
|---|---|---|---|
| 8,390,255 B1* | 3/2013 | Fathollahi | 320/115 |
| 8,456,847 B2* | 6/2013 | Hwang et al. | 361/730 |
| 8,520,373 B2* | 8/2013 | Liu | 361/679.03 |
| 8,619,422 B2* | 12/2013 | Lim et al. | 361/679.56 |
| 8,654,084 B2* | 2/2014 | Hong et al. | 345/173 |
| 8,737,052 B2* | 5/2014 | Cho et al. | 361/679.3 |
| 2003/0234897 A1* | 12/2003 | Ozawa | 349/65 |
| 2004/0204009 A1 | 10/2004 | Cheng et al. | |
| 2004/0263482 A1* | 12/2004 | Goertz | 345/173 |
| 2005/0122669 A1* | 6/2005 | Lee | 361/679 |
| 2005/0141186 A1* | 6/2005 | Shimizu | 361/683 |
| 2006/0181841 A1* | 8/2006 | Chen et al. | 361/680 |
| 2006/0233356 A1* | 10/2006 | Lu et al. | 379/433.01 |
| 2006/0250762 A1* | 11/2006 | Yang et al. | 361/681 |
| 2009/0015565 A1* | 1/2009 | Hong et al. | 345/173 |
| 2009/0082073 A1* | 3/2009 | Hori et al. | 455/575.3 |
| 2009/0175018 A1* | 7/2009 | Zaitsu | 361/800 |
| 2009/0257189 A1* | 10/2009 | Wang et al. | 361/679.56 |
| 2009/0316351 A1* | 12/2009 | Zadesky et al. | 361/679.33 |
| 2009/0323292 A1* | 12/2009 | Hwang et al. | 361/730 |
| 2010/0061040 A1 | 3/2010 | Dabov et al. | |
| 2010/0134961 A1* | 6/2010 | Huang et al. | 361/679.01 |
| 2010/0258626 A1* | 10/2010 | Watanabe et al. | 235/380 |
| 2010/0273537 A1* | 10/2010 | Jiang | 455/575.1 |
| 2010/0279694 A1* | 11/2010 | Yagi et al. | 455/436 |
| 2011/0032668 A1* | 2/2011 | Lee | 361/679.01 |
| 2011/0058320 A1* | 3/2011 | Kim et al. | 361/679.01 |
| 2011/0077063 A1* | 3/2011 | Yabe et al. | 455/575.4 |
| 2011/0164361 A1* | 7/2011 | Yoon et al. | 361/679.01 |
| 2011/0199721 A1* | 8/2011 | Allen et al. | 361/679.01 |
| 2011/0216485 A1* | 9/2011 | Kang et al. | 361/679.01 |
| 2011/0222219 A1* | 9/2011 | Bae et al. | 361/679.01 |
| 2011/0222260 A1* | 9/2011 | Goro et al. | 361/814 |
| 2011/0261510 A1* | 10/2011 | Liu | 361/679.01 |
| 2011/0261514 A1* | 10/2011 | Lee et al. | 361/679.01 |
| 2011/0279947 A1* | 11/2011 | Peng | 361/679.01 |
| 2011/0292578 A1* | 12/2011 | Lim et al. | 361/679.01 |
| 2011/0317343 A1* | 12/2011 | Shin et al. | 361/679.01 |
| 2012/0050988 A1 | 3/2012 | Rothkopf et al. | |
| 2012/0111711 A1* | 5/2012 | Cho et al. | 200/5 A |

OTHER PUBLICATIONS

"Office Action of European Counterpart Application", issued on Nov. 22, 2013, p. 1-p. 8.

"Office Action of Taiwan Counterpart Application", issued on Sep. 26, 2014, pp. 1-8, in which the listed references were cited.

"Office Action of European Counterpart Application", issued on Nov. 22, 2013, pp. 1-8, in which the listed references were cited.

\* cited by examiner

ELECTRONIC APPARATUS AND METHOD FOR ASSEMBLING THE SAME

FIELD OF THE INVENTION

The application relates to an electronic apparatus and a method for assembling the same.

DESCRIPTION OF RELATED ART

In recent years, as the technology advances, handheld devices such as mobile phones, tablet computers are more commonly used and are developed to be more convenient, multi-functional and exquisite. More and more choices like the aforementioned are provided for consumers to choose from. Users have higher demands toward the handheld devices day by day. As the time prolongs for users to hold handheld devices by hands, the feeling in holding handheld devices are getting more important.

In order to enhance the feeling in holding handheld devices, a housing surface of handheld electronic devices are often designed to have a curved surface to conform designs of ergonomics. However, according to the current stacking method of interior space of handheld devices, a battery is closer to a housing of a handheld device than a motherboard, and therefore such handheld device cannot present a smooth arc shape due to the battery disposition.

SUMMARY OF THE INVENTION

The application is directed to an electronic apparatus with a smooth and curved surface of a housing.

The application is directed to a method for assembling an electronic apparatus for assembling components in a housing.

The application provides an electronic apparatus including a housing, a motherboard, a battery module and a display module. The housing has at least an opening and an accommodating space. The motherboard is disposed in the accommodating space. The battery module is disposed in the accommodating space and stacked over the motherboard. The motherboard is located between the housing and the battery module. The display module is disposed in the accommodating space and stacked over the battery module. The battery module is located between the motherboard and the display module. At least one edge of the battery module in a width direction of the battery module is closer to a corresponding side of the housing than a corresponding edge of the motherboard in a width direction of the motherboard.

The application provides a method for assembling an electronic apparatus. A housing, a motherboard, a battery module and a display module are provided, wherein the housing has at least an opening and an accommodating space, and the battery module has assembled to the display module. The motherboard is stacked to one side of the battery module, wherein the battery module is located between the housing and the motherboard. The display module and the battery module are electrically coupled to the motherboard. An assembling operation is performed to dispose an assembly of the motherboard, the battery module and the display module in the accommodating space of the housing, such that the motherboard and the battery module are located between the housing and the display module.

In light of the foregoing, in the application, an appearance of a housing of an electronic apparatus can be presented as a smooth and curved surface to effectively utilize a space inside the housing and increase a capacity of a battery module. In addition, the method for assembling an electronic apparatus can assemble components inside a housing to effectively utilize a space inside the housing and increase a capacity of a battery module.

In order to make the aforementioned features and advantages of the application more comprehensible, embodiments accompanying figures are described in details below.

DESCRIPTION OF EMBODIMENTS

Figure 1:
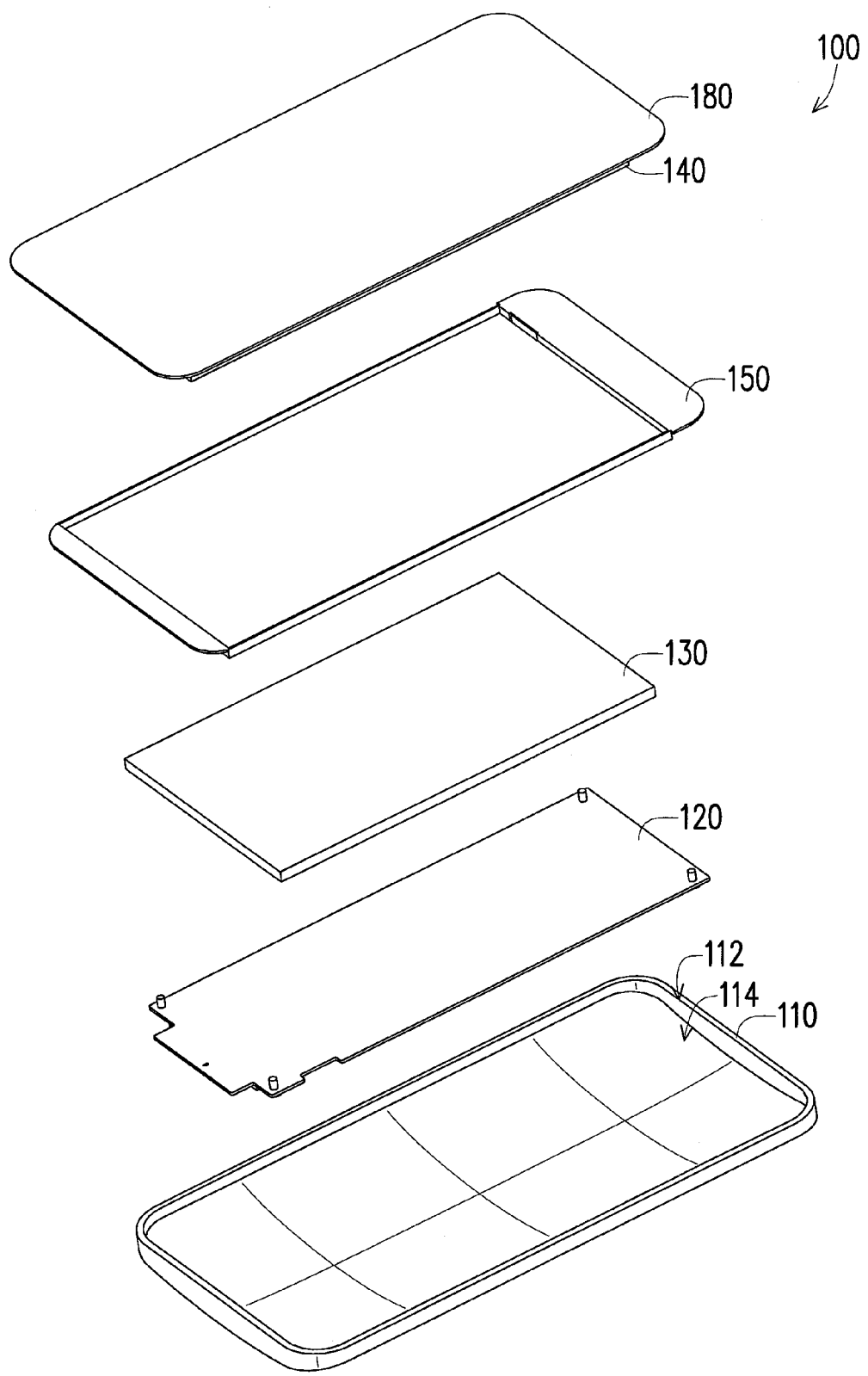
FIG. 1 is an exploded view of an electronic apparatus according to an embodiment of the application.
Figure 2:
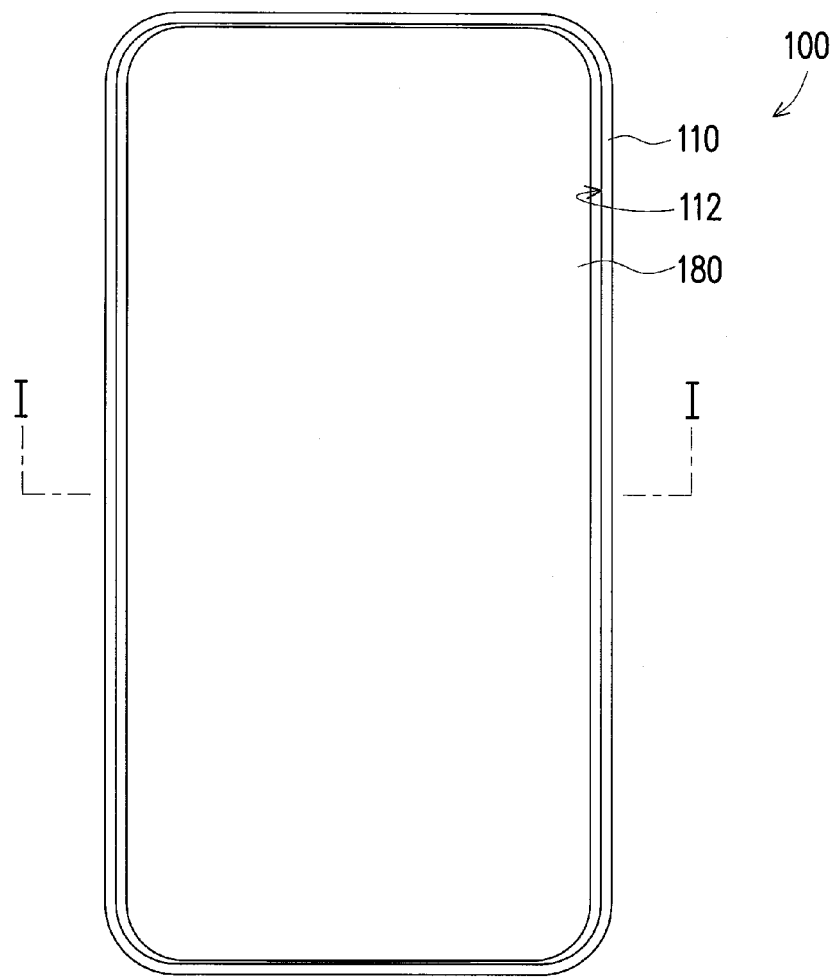
FIG. 2 is a front view of an assembled electronic apparatus of FIG. 1.
Figure 3:
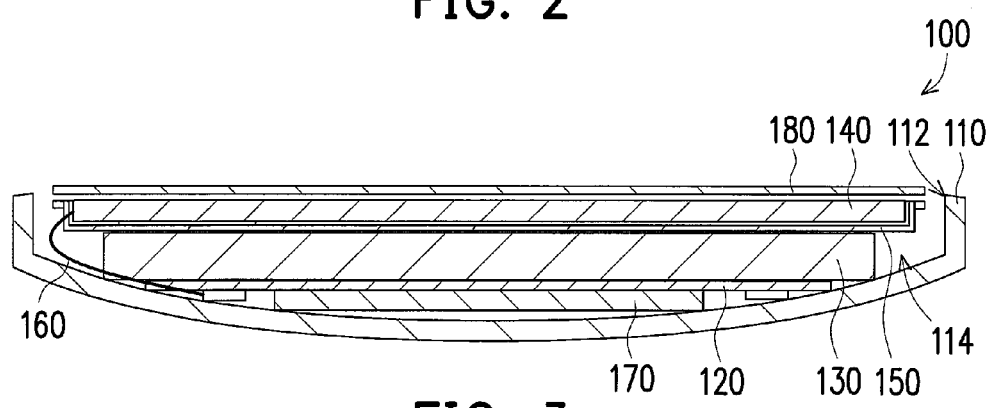
FIG. 3 is an enlarged cross-sectional view of the electronic apparatus along the line I-I of FIG. 2.

FIG. 1 is an exploded view of an electronic apparatus according to an embodiment of the application. FIG. 2 is a front view of an assembled electronic apparatus of FIG. 1. FIG. 3 is an enlarged cross-sectional view of the electronic apparatus along the line I-I of FIG. 2. Referring to FIG. 1 to FIG. 3. In the present embodiment, an electronic apparatus 100 includes a housing 110, a motherboard 120, a battery module 130 and a display module 140.

The housing 110 has at least an opening 112 and an accommodating space 114. The motherboard 120 is disposed in the accommodating space 114, wherein the motherboard 120 includes a rigid circuit board and a plurality of electronic components mounted on the rigid circuit board. The battery module 130 is disposed in the accommodating space 114 and stacked over the motherboard 120, wherein the motherboard 120 is located between the housing 110 and the battery module 130. The display module 140 is disposed in the accommodating space 114 and stacked over the battery module 130, wherein the battery module 130 is located between the motherboard 120 and the display module 140. The display module 140 can have either a plug-in or build-in touch module.

In the present embodiment, a width of the motherboard 120 is narrower than a width of the battery module 130, and the width of the battery module 130 is narrower that a width of the display module 140. Accordingly, an appearance of the housing 110 can be presented as a smooth arc shape. Meanwhile, the width of the battery module 130 is widened when the battery module 130 is moved to a location between the motherboard 120 and the display module 140. As a result, with the same length and thickness, the width of the batter module 130 is widened to increase a capacity of the battery module 130.

It should be noted that any width of any member disclosed in the application is a width in a horizontal direction of the member illustrated in FIG. 2 or FIG. 3.

Figure 4:
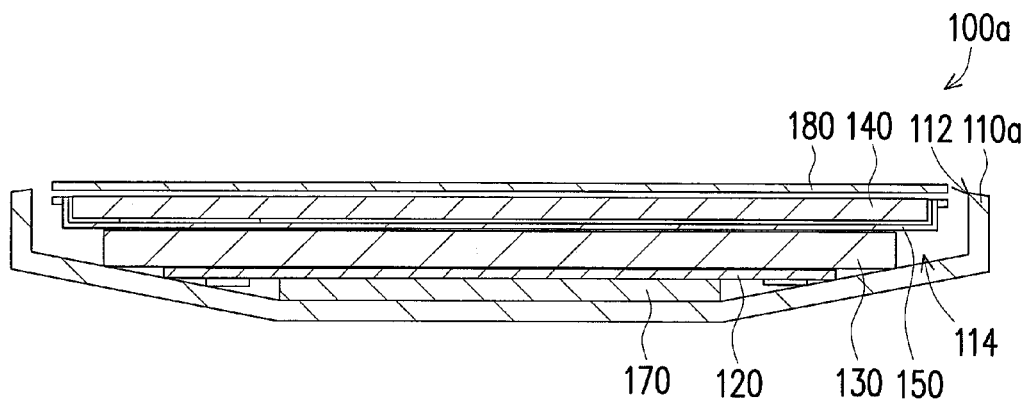
FIG. 4 is an enlarged cross-sectional view of an electronic apparatus according to another embodiment of the application.

Referring to FIG. 3 again. In the present embodiment, the housing 110 can extend along a curved surface, and edges of the motherboard 120 and edges of the battery module 130 lean against the housing 110. In another embodiment illustrating an electronic apparatus 100a, as shown in FIG. 4, a housing 110a can extend along an inclined plane.

Referring to FIG. 1 and FIG. 3 again. In the present embodiment, the electronic apparatus 100 further includes a frame 150 wherein the frame 150 is disposed between the battery module 130 and the display module 140 to secure a relative position between the battery module 130 and the display module 140.

Referring to FIG. 3 again. In the present embodiment, the electronic apparatus 100 further includes a flexible printed circuit board 160 that connects the motherboard 120 and the display module 140. Specifically, the flexible printed circuit board 160 bypasses the battery module 130 and connects the motherboard 120 and the display module 140.

Referring to FIG. 3 again. In the present embodiment, the electronic apparatus 100 further includes a shield member 170 disposed in the accommodating space 114, wherein the shield member 170 is located between a bottom of the housing 110 and the motherboard 120, and a width of the shield member 170 is narrower than the width of the motherboard 120.

Referring to FIG. 1 and FIG. 3 again. In the present embodiment, the electronic apparatus 100 further includes a cover plate 180 disposed at the opening 112 of the housing 110, such that the display module 140 is located between the battery module 130 and the cover plate 180. The width of the display module 140 is narrower than a width of the cover plate 180.

Figure 5:
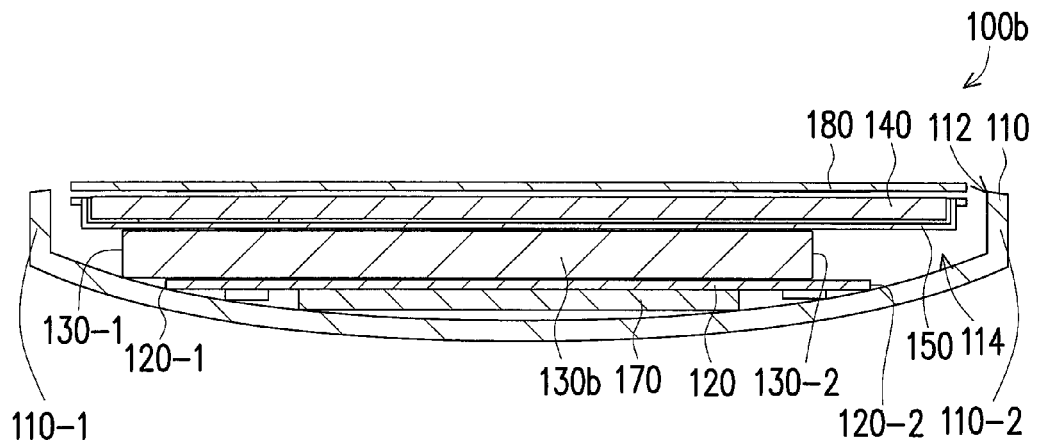
FIG. 5 is an enlarged cross-sectional view of an electronic apparatus according to yet another embodiment of the application.

FIG. 5 is an enlarged cross-sectional view of an electronic apparatus according to yet another embodiment of the application. Referring to FIG. 5. According to an electronic apparatus 100b of the present embodiment, one edge 130-1 of a battery module 130b in a width direction of the battery module 130b is closer to a corresponding side 110-1 of the housing 110 than a corresponding edge 120-1 of the motherboard 120 in a width direction of the motherboard 120. In addition, one edge 130-2 of the battery module 130b in a width direction of the battery module 130b is not closer to a corresponding side 110-2 of the housing 110 than a corresponding edge 120-2 of the motherboard 120 in a width direction of the motherboard 120. As a result, according to embodiments of FIG. 3 and FIG. 5, at least one edge of the battery module in a width direction of the battery module is closer to a corresponding side of the housing than a corresponding edge of the motherboard in a width direction of the motherboard.

Figure 6:
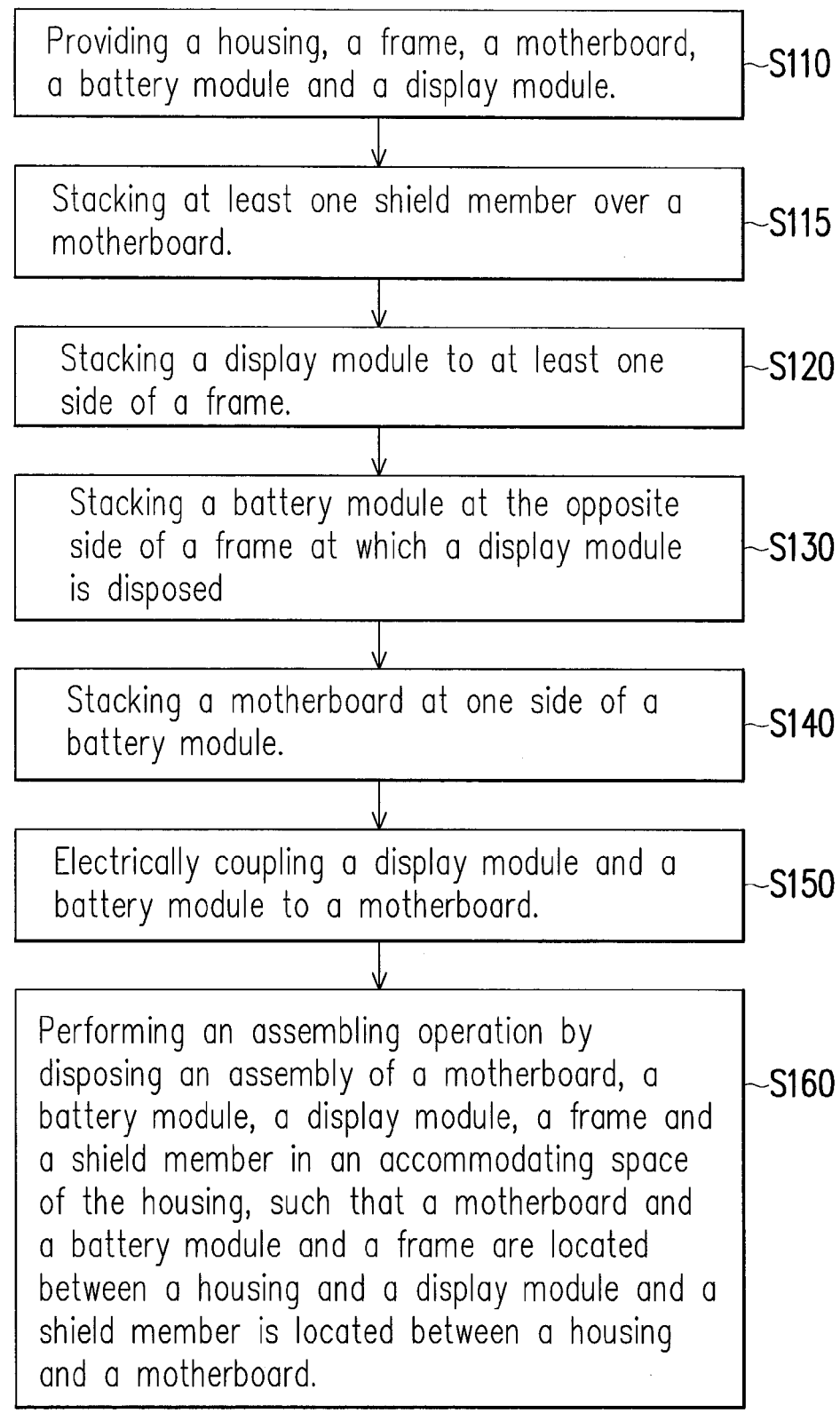
FIG. 6 is a flow chart of a method for assembling an electronic apparatus according to an embodiment of the application.

FIG. 6 is a flow chart of a method for assembling an electronic apparatus according to an embodiment of the application. Referring to FIG. 1 and FIG. 6. In Step S110, the housing 110, the motherboard 120, the battery module 130, the display module 140 and the frame 150 are provided, wherein the housing 110 has the opening 112 and the accommodating space 114, the width of the motherboard 120 is narrower than the width of the battery module 130, and the width of battery module 130 is narrower than the width of the display module 140. In Step S120, the display module 140 is stacked at one side of the frame 150.

In Step S130, the battery module 130 is stacked at the opposite side of the frame 150 at which the display module 140 is disposed. In Step S140, the motherboard 120 is stacked at one side of the battery module 130. In Step S150, the display module 140 and the battery module 130 are electrically coupled to the motherboard 120. In Step S160, an assembling operation is performed, wherein an assembly of the motherboard 120, the battery module 130, the display module 140 and the frame 150 are disposed in the accommodating space 114 of the housing 110.

Referring to FIG. 3 and FIG. 6. The present embodiment further includes Step S115. In Step S115, before performing the assembling operation (Step S160), the shield member 170 is stacked over the motherboard 120, wherein the width of the shield member 170 is narrower than the width of the motherboard 120. After the assembling operation (Step S160) is performed, the shield member 170 is also disposed in the accommodating space 114 and located between the housing 110 and the motherboard 120.

Referring to FIG. 3 and FIG. 6. In the present embodiment, a step of electrically coupling the display module 140 to the motherboard 120 in Step S150 includes having the flexible printed circuit board 160 bypassing the battery module 130 and connecting the display module 140 and the motherboard 120.

In light of the foregoing, the application presents an appearance of an electronic apparatus as a smooth arc shape, and a stacking method inside a space of the electronic apparatus allows interior components to be disposed in a housing with a design of a curved surface or an inclined plane. Accordingly, the application can effectively utilize an interior space of a housing to increase a capacity of a battery module.

Although the application has been described with reference to the above embodiments, it is not intended to limit the application. It will be apparent to people of ordinary skill in the art that modifications and variations to the described embodiments may be made without departing from the spirit and scope of the application. Accordingly, the scope of the application will be defined by the attached claims not by the above detailed descriptions.

What is claimed is:

1. An electronic apparatus, comprising:
    a housing having at least an opening and an accommodating space;
    a motherboard disposed in the accommodating space;
    a battery module disposed in the accommodating space and stacked over the motherboard, wherein the motherboard is located between the housing and the battery module; and
    a display module disposed in the accommodating space and stacked over the battery module, wherein the battery module is located between the motherboard and the display module, and at least one edge of the battery module in a width direction of the battery module is closer to a corresponding side of the housing than a corresponding edge of the motherboard in a width direction of the motherboard, and the edge of the motherboard and the edge of the battery module lean against a part of the housing.

2. The electronic apparatus of claim 1, wherein the width of the motherboard is narrower than the width of the battery module and the width of the battery module is narrower than a width of the display module.

3. The electronic apparatus of claim 1, wherein the part of the housing extends along a curved surface or an inclined plane.

4. The electronic apparatus of claim 1, further comprising:
    a frame disposed between the battery module and the display module to secure a relative position between the battery module and the display module.

5. The electronic apparatus of claim 1, further comprising:
    a flexible printed circuit board connecting the motherboard and the display module.

6. The electronic apparatus of claim 5, wherein the flexible printed circuit board bypasses the battery module and connects the motherboard and the display module.

7. The electronic apparatus of claim 1, further comprising:
at least one shielding member disposed in the accommodating space and located between the housing and the motherboard, wherein a width of the shield member is narrower than the width of the motherboard.

8. The electronic apparatus of claim 1, further comprising:
a cover plate disposed at the opening, wherein the display module is located between the battery module and the cover plate.

9. The electronic apparatus of claim 8, wherein a width of the display module is narrower than a width of the cover plate.

10. An electronic apparatus, comprising:
a housing having at least an opening and an accommodating space;
a motherboard disposed in the accommodating space;
a battery module disposed in the accommodating space and stacked over the motherboard, wherein the motherboard is located between the housing and the battery module; and
a display module disposed in the accommodating space and stacked over the battery module, wherein the battery module is located between the motherboard and the display module, and at least one edge of the battery module in a width direction of the battery module is closer to a corresponding side of the housing than a corresponding edge of the motherboard in a width direction of the motherboard, and one edge of the battery module extends beyond one corresponding edge of the motherboard.

11. The electronic apparatus of claim 10, wherein the width of the motherboard is narrower than the width of the battery module and the width of the battery module is narrower than a width of the display module.

12. The electronic apparatus of claim 10, wherein the part of the housing extends along a curved surface or an inclined plane.

13. The electronic apparatus of claim 10, further comprising:
a frame disposed between the battery module and the display module to secure a relative position between the battery module and the display module.

14. The electronic apparatus of claim 10, further comprising:
a flexible printed circuit board connecting the motherboard and the display module.

15. The electronic apparatus of claim 14, wherein the flexible printed circuit board bypasses the battery module and connects the motherboard and the display module.

16. An electronic apparatus, comprising:
a housing having at least an opening and an accommodating space;
a motherboard disposed in the accommodating space;
a battery module disposed in the accommodating space and stacked over the motherboard, wherein the motherboard is located between the housing and the battery module; and
a display module disposed in the accommodating space and stacked over the battery module, wherein the battery module is located between the motherboard and the display module, and at least one edge of the battery module in a width direction of the battery module is closer to a corresponding side of the housing than a corresponding edge of the motherboard in a width direction of the motherboard, and the width of the motherboard is narrower than the width of the battery module and the width of the battery module is narrower than a width of the display module.

17. The electronic apparatus of claim 16, wherein the part of the housing extends along a curved surface or an inclined plane.

18. The electronic apparatus of claim 16, further comprising:
a frame disposed between the battery module and the display module to secure a relative position between the battery module and the display module.

19. The electronic apparatus of claim 16, further comprising:
a flexible printed circuit board connecting the motherboard and the display module.

20. The electronic apparatus of claim 19, wherein the flexible printed circuit board bypasses the battery module and connects the motherboard and the display module.

* * * * *